US012790715B2

(12) United States Patent
Pan et al.

(10) Patent No.: US 12,790,715 B2
(45) Date of Patent: Nov. 10, 2026

(54) APPARATUS AND METHOD FOR REGULATING HOT ZONE FOR SINGLE CRYSTAL GROWTH

(71) Applicants: XI'AN ESWIN MATERIAL TECHNOLOGY CO., LTD., Xi'an (CN); XI'AN ESWIN SILICON WAFER TECHNOLOGY CO., LTD., Xi'an (CN)

(72) Inventors: Hao Pan, Xi'an (CN); Hyunguk Jeon, Xi'an (CN)

(73) Assignees: XI'AN ESWIN MATERIAL TECHNOLOGY CO., LTD., Xi'an (CN); XI'AN ESWIN SILICON WAFER TECHNOLOGY CO., Xi'an (CN)

( * ) Notice: Subject to any disclaimer, the term of this patent is extended or adjusted under 35 U.S.C. 154(b) by 305 days.

(21) Appl. No.: 18/550,651

(22) PCT Filed: Sep. 29, 2022

(86) PCT No.: PCT/CN2022/122631
§ 371 (c)(1),
(2) Date: Sep. 14, 2023

(87) PCT Pub. No.: WO2023/124334
PCT Pub. Date: Jul. 6, 2023

(65) Prior Publication Data

US 2024/0158952 A1 May 16, 2024

(30) Foreign Application Priority Data

Dec. 29, 2021 (CN) ........................ 202111632073.9

(51) Int. Cl.
*C30B 15/22* (2006.01)
*C30B 15/14* (2006.01)
*C30B 29/06* (2006.01)

(52) U.S. Cl.
CPC .............. *C30B 15/22* (2013.01); *C30B 15/14* (2013.01); *C30B 29/06* (2013.01)

(58) Field of Classification Search
CPC ......... C30B 15/14; C30B 15/22; C30B 15/26; C30B 29/06
See application file for complete search history.

(56) References Cited

U.S. PATENT DOCUMENTS 3,337,303 A 8/1967 Lorenzini
5,450,814 A * 9/1995 Shiraishi ................ C30B 15/14 117/30

(Continued)

FOREIGN PATENT DOCUMENTS

CN 101148777 A 3/2008
CN 101532172 A 9/2009

(Continued)

OTHER PUBLICATIONS

Japanese Office Action corresponding to Japanese Patent Application No. 2023-509541, dated Mar. 25, 2024. (5 Pages).

(Continued)

*Primary Examiner* — Hua Qi
(74) *Attorney, Agent, or Firm* — Maginot, Moore & Beck

(57) ABSTRACT

An apparatus for regulating at least one hot zone for growing a silicon single crystal which is arranged inside a crystal puller includes an insulator, a first control unit and a second control unit. The insulator has a top on which a reflector is fixedly arranged. The first control unit is configured to keep a position of a crucible in a height direction unchanged during growth of the silicon single crystal. The second (Continued)

control unit is configured to move the insulator along a vertical direction during growth of the silicon single crystal, so as to keep a distance between a bottom of the reflector and a liquid surface of silicon melt constant.

6 Claims, 6 Drawing Sheets

(56) References Cited

U.S. PATENT DOCUMENTS

| | | | | |
|---|---|---|---|---|
| 5,840,115 | A * | 11/1998 | Taguchi | C30B 15/12 117/30 |
| 5,853,480 | A | 12/1998 | Kubota et al. | |
| 6,136,090 | A | 10/2000 | Araki et al. | |
| 2001/0054376 | A1* | 12/2001 | Miura | C30B 15/20 117/13 |
| 2006/0016387 | A1* | 1/2006 | Yokoyama | C30B 15/14 117/84 |
| 2006/0130740 | A1* | 6/2006 | Sakurada | C30B 15/203 117/20 |
| 2007/0131158 | A1 | 6/2007 | Ura et al. | |
| 2007/0277727 | A1 | 12/2007 | Hayakawa et al. | |
| 2009/0061140 | A1 | 3/2009 | Sadohara et al. | |
| 2009/0072202 | A1 | 3/2009 | Ren et al. | |
| 2016/0194783 | A1* | 7/2016 | Takeyasu | C30B 15/14 117/217 |
| 2022/0042203 | A1 | 2/2022 | Yang et al. | |

FOREIGN PATENT DOCUMENTS

| | | | | |
|---|---|---|---|---|
| CN | 101724891 | A | 6/2010 | |
| CN | 201793813 | U | 4/2011 | |
| CN | 102162123 | A | 8/2011 | |
| CN | 102181925 | A | 9/2011 | |
| CN | 105442037 | A | 3/2016 | |
| CN | 105531406 | A | 4/2016 | |
| CN | 205205271 | U | 5/2016 | |
| CN | 205711031 | U | 11/2016 | |
| CN | 110453277 | A | 11/2019 | |
| CN | 111020691 | A | 4/2020 | |
| CN | 111647940 | A | 9/2020 | |
| CN | 111778549 | A | 10/2020 | |
| CN | 112144106 | A | 12/2020 | |
| CN | 112226812 | A | 1/2021 | |
| CN | 112522779 | A | 3/2021 | |
| CN | 113151892 | A | 7/2021 | |
| CN | 113818074 | A | 12/2021 | |
| CN | 114277434 | A | 4/2022 | |
| DE | 112014003795 | T5 | 6/2016 | |
| GB | 1287789 | A | 9/1972 | |
| JP | S6067877 | A | 4/1985 | |
| JP | S61183971 | A | 8/1986 | |
| JP | H05194079 | A | 8/1993 | |
| JP | H05194080 | A | 8/1993 | |
| JP | H06279168 | A | 10/1994 | |
| JP | H09286692 | A | 11/1997 | |
| JP | H1083595 | A | 3/1998 | |
| JP | H11228286 | A | 8/1999 | |
| JP | 2003267795 | A | 9/2003 | |
| JP | 2005231944 | A | 9/2005 | |
| JP | 2006273631 | A | 10/2006 | |
| JP | 2007223814 | A | 9/2007 | |
| JP | 2012101974 | A | 5/2012 | |
| KR | 20070115711 | A | 12/2007 | |
| KR | 20100052142 | A | 5/2010 | |
| KR | 101644062 | B1 | 7/2016 | |
| KR | 20180057999 | A * | 5/2018 | C30B 29/06 |
| TW | I746400 | B | 11/2021 | |

OTHER PUBLICATIONS

English Translation of Japanese Office Action corresponding to Japanese Patent Application No. 2023-509541, dated Mar. 25, 2024. (5 Pages).
Korean Office Action corresponding to Korean Patent Application No. 10-2023-7004794, dated Apr. 11, 2024. (7 Pages).
English Translation of Korean Office Action corresponding to Korean Patent Application No. 10-2023-7004794, dated Apr. 11, 2024. (6 Pages).
Machine English Translation of JPS61183971A. (4 Pages).
Machine English Translation of JPH05194080A. (8 Pages).
Machine English Translation of JPH06279168A. (8 Pages).
Machine English Translation of JPS6067877A. (13 Pages).
Machine English Translation of JP2003267795A. (10 Pages).
Machine English Translation of JP2007223814A. (21 Pages).
Machine English Translation of JPH1083595A. (18 Pages).
Machine English Translation of JPH05194079A. (7 Pages).
German Office Action corresponding to German Patent Application No. 11 2022 000 964.0, dated Apr. 30, 2025. (12 Pages).
Korean Office Action corresponding to Korean Patent Application No. 10-2023-7004794, dated Mar. 17, 2025. (10 Pages).
Written Opinion and International Search Report of the International Search Authority corresponding to International Application No. PCT/CN2022/122631, dated Dec. 15, 2022. (10 pages).
English Translation of Written Opinion and International Search Report of the International Search Authority corresponding to International Application No. PCT/CN2022/122631, dated Dec. 15, 2022. (5 pages).
Chinese Office Action corresponding to Chinese Patent Application No. 202111632073.9, dated Sep. 15, 2022. (9 Pages).
English Translation of Chinese Office Action corresponding to Chinese Patent Application No. 202111632073.9, dated Sep. 15, 2022. (10 Pages).
Taiwanese Office Action corresponding to Taiwanese Patent Application No. 111131490, dated Apr. 11, 2023. (9 Pages).
English Translation Taiwanese Office Action corresponding to Taiwanese Patent Application No. 111131490, dated Apr. 11, 2023. (3 Pages).
Machine English Translation of CN112144106A. (14 Pages).
Machine English Translation of TW202229665A. (12 Pages).
Machine English Translation of CN114277434A. (13 Pages).
Machine English Translation of CN110453277A. (17 Pages).
Machine English Translation of CN111778549A. (9 Pages).
Machine English Translation of CN111020691A. (32 Pages).
Machine English Translation of CN102162123A. (10 Pages).
Machine English Translation of CN101724891A. (8 Pages).
Machine English Translation of CN205711031U. (7 Pages).
Machine English Translation of CN205205271U. (7 Pages).
Machine English Translation of CN201793813U. (6 Pages).
Machine English Translation of CN113151892A. (22 Pages).
Machine English Translation of CN112522779A. (16 Pages).
Machine English Translation of CN112226812A. (23 Pages).
Machine English Translation of CN105442037A. (11 Pages).
Machine English Translation of CN102181925A. (11 Pages).
Machine English Translation of CN113818074A. (17 Pages).
Japanese Office Action corresponding to Japanese Patent Application No. 2023-509541, dated Aug. 20, 2024. (4 Pages).
English Translation of Japanese Office Action corresponding to Japanese Patent Application No. 2023-509541, dated Aug. 20, 2024. (4 Pages).
Machine English Translation of CN101532172A. (5 Pages).

* cited by examiner

APPARATUS AND METHOD FOR REGULATING HOT ZONE FOR SINGLE CRYSTAL GROWTH

CROSS-REFERENCE TO RELATED APPLICATIONS

This application is the U.S. national phase of PCT Application No. PCT/CN2022/122631 filed on Sep. 29, 2022, which claims a priority to Chinese Patent application Ser. No. 202111632073.9 filed on Dec. 29, 2021, the disclosures of which are incorporated in their entirety by reference herein.

TECHNICAL FIELD

The present disclosure relate to the technical field of hot zone regulation during a crystal pulling process, and in particular to an apparatus and a method for regulating hot zone for single crystal growth.

BACKGROUND

The methods for manufacturing monocrystalline silicon ingots include a Float-zone (FZ) method and a Czochralski method, and the Czochralski (CZ) method is usually used. In the CZ method, polycrystalline silicon feedstocks are contained in a quartz crucible arranged in the crystal puller under the protection of argon gas; the polycrystalline silicon feedstocks are melted by a heater to obtain molten silicon, and the molten silicon is heated continuously through the heater to maintain the temperature of the molten silicon. A rod-shaped seed crystal (also called seed) with a diameter of only 10 mm is placed in contact with a liquid surface of the molten melt. At the appropriate temperature required by the crystal pulling process, silicon atoms in the molten silicon will form regular crystals on the solid-liquid interface along the silicon atom arrangement structure of the seed crystal, that is, growing into a single crystal. When rotating and pulling the seed crystal, silicon atoms in the molten silicon will continue to crystallize on the previously formed single crystal and continue its regular atomic arrangement structure. With the progress of accelerating crystal pulling process, monocrystalline silicon ingots with a targeted diameter and quality will be produced.

Refer to FIG. 1, it shows a schematic view of a commonly used crystal puller 10. The crystal puller 10 comprising a puller body 11, a crucible 12, a heater 13, an insulator 14, a reflector 15 and a seed crystal lifting apparatus 16. The heater 13, the insulator 14 and the reflector 15 are all fixed structures. The growth environment during the crystal pulling process must be strictly controlled to ensure that high-quality monocrystalline silicon ingots S with fewer defects are grown. This is because in the process of growing the monocrystalline silicon ingot by a CZ method, the process gas is filled from the top of the crystal puller 10, and in order to ensure that the volatile substance can be discharged in a timely manner, the reflector 15 arranged above the crucible 12, the process gas needs to pass through the reflector 15 and the inner wall of the puller body 11. Then the process gas is discharged from a bottom exhaust port of the crystal puller 10 by a vacuum pump. During the formation of the crystal ingot S, specifically during the monocrystalline silicon ingot S is grown at the solid-liquid interface, since the molten silicon continues to transform from liquid state to solid state and form crystals on the seed, the liquid surface position of the silicon melt continuously draw down as the silicon melt in the crucible 12 continuously reduces. In order to ensure that the liquid surface of the silicon melt is always in contact with the crystal, the crucible 12 needs to be continuously lifted upward. Moreover, in order to avoid contact between the reflector 15 and the liquid surface of the silicon melt and to ensure a stable gas flow, the relative height of the reflector 15 and the liquid surface has to be consistent. Thus, the crucible 12 has to be moved up simultaneously with the crystal pulling. At the same time, the CZ method maintains the stability of the thermal field inside the crystal puller mainly through simultaneous rise and rotation of the crucible and the seed. However, rise of the crucible brings considerable disadvantages to the energy consumption and the stability of the thermal field inside the crystal puller.

SUMMARY

In view of the above, embodiments of the present disclosure provide an apparatus and a method for regulating hot zone during single crystal growth, both of which are capable of maintaining a consistent distance between the reflector and the liquid surface of the silicon melt by adjusting the insulator during the crystal pulling process; and at the same time the heater is capable to be independently adjusted to cooperate with the movement of the insulator to achieve diverse hot zone control. The embodiments of the present disclosure thus provide more hot zone regulation ways for the crystal pulling process and improve efficiency of the crystal pulling process.

The technical solutions of embodiments of the present disclosure are as follows.

In a first aspect, embodiments of the present disclosure provide an apparatus for regulating hot zone for single crystal growth, which is arranged inside a crystal puller and comprises:

- an insulator on the top of which with a reflector is fixedly arranged; and
- a first control unit and a second control unit, in which the first control unit is configured to keep a height position of a crucible in a height direction unchanged during a crystal pulling process, and the second control unit is configured to move the insulator along a vertical direction during growth of the silicon single crystal, so as to keep a distance between a bottom of the reflector and a liquid surface of the silicon melt constant.

In second aspect, embodiments of the present disclosure provide a method for regulating hot zone during single crystal growth, the method for regulating hot zone comprises:

- before growth of the silicon single crystal, moving the insulator with the reflector to a highest position insulator, and after polycrystalline silicon feedstock is completely melted into silicon melt, adjusting the reflector to a position at a distance from the liquid surface of the silicon melt; and
- controlling the height position of the crucible unchanged and rotating the crucible during the crystal pulling process, and moving the insulator with the reflector downward in the vertical direction so as to keep the distance between a bottom of the reflector and the liquid surface of the silicon melt constant during the crystal pulling process.

Embodiments of the present disclosure provide an apparatus and a method for regulating hot zone during single crystal growth, both of which are capable of keeping a constant distance between the reflector and the liquid surface of the silicon melt by allowing the reflector to move up and down along the vertical direction through the insulator during the crystal pulling process. The embodiments of the present disclosure also are capable of independently adjusting the heater and cooperating with the movement of the insulator to achieve diverse hot zone control. Thus the embodiments of the present disclosure provide more methods and support for the adjustment of process parameters, effectively increase the crystal pulling speed as well as reduce the oxygen concentration in the pulled crystal ingots, in other words, the embodiments of the present disclosure makes it easy to increase the crystal pulling speed and reduce the oxygen concentration in the pulled crystal ingots, and make the monocrystalline silicon ingots cool faster and grow faster compared to the related technology.

DETAILED DESCRIPTION

The technical solutions in the embodiments of the present disclosure will be described hereinafter in conjunction with the drawings in the embodiments of the present disclosure in a clear and complete manner.

In the process of pulling monocrystalline silicon by the CZ method in a crystal puller, the silicon melt liquid surface will vibrate and the monocrystalline silicon ingot will shake due to the instability of the protective gas flow and the vibration caused by mechanical transmission during rising of the crucible. The shaking monocrystalline silicon ingot and instable solid-liquid interface of silicon melt will destroy the stability of the thermal field in the crystal puller, leading to the formation of crystal defects. The above-mentioned problems make crystal difficult to grow without dislocation, even have a very negative impact on the quality of the crystal.

Figure 1:
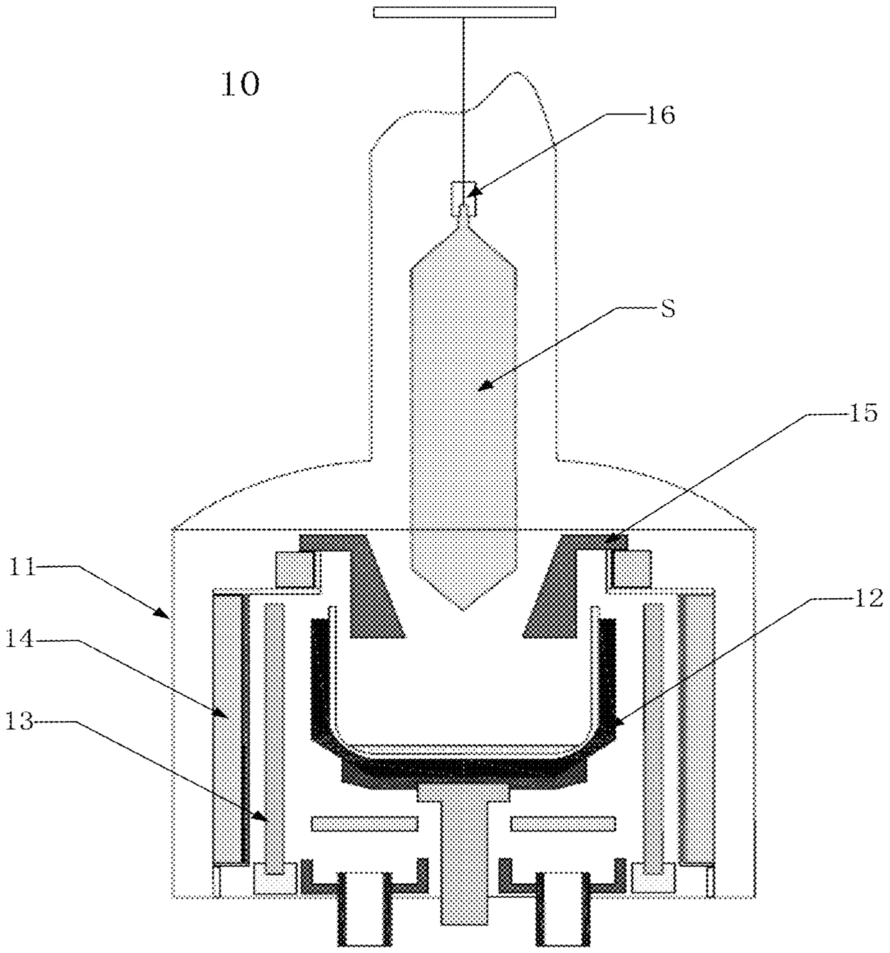
FIG. 1 Prior Art
FIG. 1 is a schematic view of a crystal puller in the prior art.

Refer to FIG. 1 again, as the crystal pulling process progresses, the crucible 12 slowly rises along the vertical direction to ensure that the distance between the crucible 12 and the monocrystalline silicon ingot S maintains within the desired range. And the crucible 12 is driven to rise slowly by mechanical parts, and as the heater 13 remains still, the mechanical parts for driving the crucible 12 locates in the thermal field produced by the heater 13 for a long time and passively receives the thermal radiation from the heater 13, resulting in a service life of the crucible 12 being reduced. Moreover, the movement accuracy of this mechanical part is also influenced to some extent due to the principle of Thermal Expansion, which in turn affects the stability of the solid-liquid interface of silicon melt in the crucible 12 during the crystal pulling process.

Therefore, in view of the above technical problems, the present disclosure proposes an apparatus for regulating hot zone for single crystal growth, in which the reflector is moved down by an insulator instead of rising up the crucible, so that the height position of the crucible remains unchanged and the crystal pulling efficiency is improved. Refers to FIG. 2, it shows a schematic structure of a crystal puller 100 with the apparatus for regulating hot zone, which may at least comprises an insulator 14 on the top of which a reflector 15 is fixedly arranged, a first control unit T1 and a second control unit T2.

Figure 2:
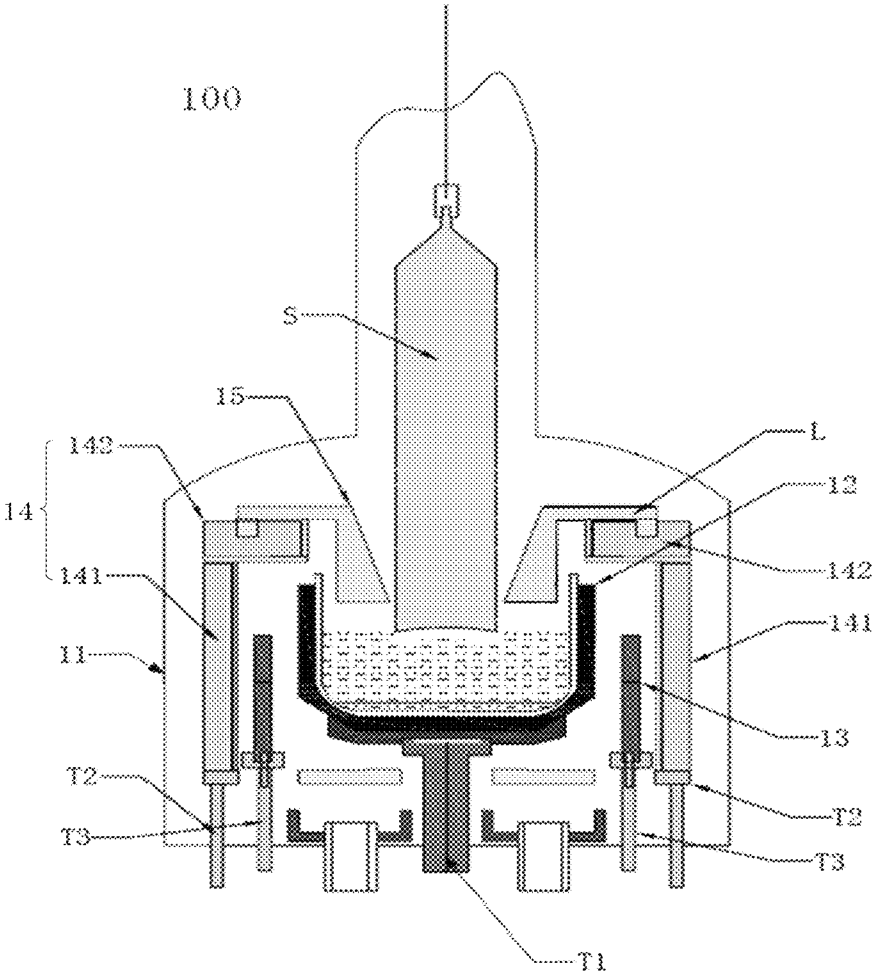
FIG. 2 is a schematic view of crystal puller with an apparatus for regulating hot zone for single crystal growth provided by an embodiment of the present disclosure.

The insulator 14 is arranged between the puller body 11 and the heater 13 of the crystal puller, and is able to prevent the heat energy of the thermal field inside the crystal puller 100 from radiating outward. The insulator 14 may be made of rigid carbon felts. In order to improve effects of thermal insulation and temperature maintenance, an advanced honeycomb structure may also be used. Refer to FIG. 2, the heat insulator 14 comprises at least a side heat insulation cover 141 and a top heat insulation cover 142. The heat insulator 14 can be integrated molding, or can be formed in segments and then be assembled. The manufacturing cost of the insulator assembled in segments is low, and it is easy to replace the damaged segments. The side heat insulation cover 141 is arranged parallel to the heater 13, and is used to enclose the heater 13 to prevent the heat energy of the heater 13 from radiating outward, thereby enhancing the heating effect of the heater 13 and reducing heat energy loss. The top heat insulation cover 142 extends in the horizontal direction from the top of the side heat insulation cover 141 towards the growing monocrystalline silicon ingot S, to a position over the crucible 12. The top heat insulation cover 142 is used to reduce loss of the heat energy from the thermal field though the top of the crystal puller, thus increasing the efficiency of the hot zone during the crystal pulling process.

The reflector 15, which is fixedly arranged on the top heat insulation cover 142, is in a shape of cone with a large top and a small bottom. The reflector 15 mainly plays a role of guiding flow of high temperature gas, and therefore has good heat resistance and certain mechanical properties. The reflector 15 also has properties of temperature maintenance and thermal insulation, and is used to ensure that the silicon melt in the crucible 12 has a suitable temperature gradient both in the radial and the axial direction of the pulled monocrystalline silicon ingot S. In addition, the reflector 15 is configured to reduce the deposition of silicon monoxide (SiO) on the upper part of the crystal puller 100 to ensure that the pulled monocrystalline silicon ingot S is of good quality, and to extend the service life of each component in the crystal puller 100. At present, most of reflectors are assembled reflectors consisting of a thin-walled conical outer tube made of graphite, a sandwiched core made of felt and a thin-walled conical inner tube made of graphite. Optionally, the reflector 15 and the top heat insulation cover 142 can be detachably connected by a hook L.

The first control unit T1 is connected to the bottom of the crucible 12, and controls mechanical parts to maintain the height position of the crucible 12 unchanged and to rotate the crucible 12 about the center axis itself during pulling the crystal ingot S. The second control unit T2 is connected to the insulator 14, and optionally mounted at the bottom of the insulator 14 to avoid the problems that the transmission accuracy of the mechanical parts is adversely affected due to the second control unit T2 being subjected to prolonged thermal radiation inside the crystal puller. The second control unit T2 is configured to move the insulator 14 along the vertical direction by a mode of transmission mechanism such as an electro-motor or a ball screw. According to the inventive concept that moving the reflector 15 downward through the insulator 14 instead of moving the crucible 12 upward, the height position of the crucible 12 remains unchanged during the crystal pulling process, and the second control unit T2 is configured to move the insulator 14 downward, which results in the reflector 15 on the top of which the insulator 14 fixedly arranged move down accordingly, and making the bottom of the reflector 15 enter into the crucible 12. The distance between the bottom of the reflector 15 and the liquid surface of the silicon melt is always maintained within a reasonable range that can ensure the quality of the pulled monocrystalline silicon ingots. Optionally, the distance between the bottom of the reflector and the liquid surface of the silicon melt is always kept constant.

The apparatus for regulating hot zone also includes a level sensor and a processor both of which are electrically connected thereto (not shown). The level sensor may be a camera of Charge Coupled Device (CCD), a digital camera or a high-definition camera, and other imaging devices. The real-time information about the variation status of the liquid surface of the silicon melt in the crucible is able to be obtained by the level sensor. The processor processes the information received from the level sensor about the variation status of the liquid surface of the silicon melt, then obtains the drop of the level of the liquid surface of the silicon melt during the crystal pulling process, and sends a control signal to the second control unit T2. The second control unit T2 accurately adjusts the descent height of the insulator 14 according to this control signal to precisely regulate the distance between the bottom of the reflector 15 and the liquid surface of the silicon melt, for ensuring that the bottom of the reflector 15 does not contact with the liquid surface of the silicon melt. Optionally, the processor is connected to the second control unit T2 by wire to ensure the stability of signal transmission from the processor.

Refer to FIG. 2, the heater 13 is arranged around the periphery of the crucible 12 to radiate heat to the crucible 12 to melt the silicon feedstocks to obtain silicon melt, and to keep the silicon melt at a temperature conducive to the pulling of monocrystalline silicon ingot S. In the related technology, the heater is fixed and not able to move when pulling the monocrystalline silicon ingot. Thus, when the monocrystalline silicon ingot is pulled from the silicon melt, the monocrystalline silicon ingot that has been formed at the top of the silicon melt liquid surface is still within the thermal radiation range of the heater. It not only leads to slow heat dissipation from the monocrystalline silicon ingot, which results in reduced cooling rate and being unable to effectively improve the pulling speed, but also decreases the oxygen concentration of the monocrystalline silicon ingots. When the insulator 14 is moved down through the second control unit T2, the insulator 14 is lower than the heater 13, so that temperature maintenance effect of the insulator 14 is degraded, and the liquid surface of the silicon melt is unable to be adequately heated and subsequently the oxygen concentration of the monocrystalline silicon ingots S is unable to be adequately reduced. To solve this problem, the apparatus for regulating hot zone according to the present disclosure also includes a third control unit T3, which is capable of supporting the heater 13 from below and moving the heater 13 downward along vertical direction to cooperate with lowering down of the insulator 14. With the above-mentioned structure, the pulled monocrystalline silicon ingot S is in an easy cooling state, which improves the cooling efficiency and increases the crystal pulling speed. The second control unit T2 and the third control unit T3 are configured to move the insulator 14 and the heater 13 respectively, so as to ensure the height position relationship between the heater 13 and the insulator 14. Therefore, there is no deterioration of the crystallization quality or low efficiency of pulling the monocrystalline silicon ingot.

Figure 3A:
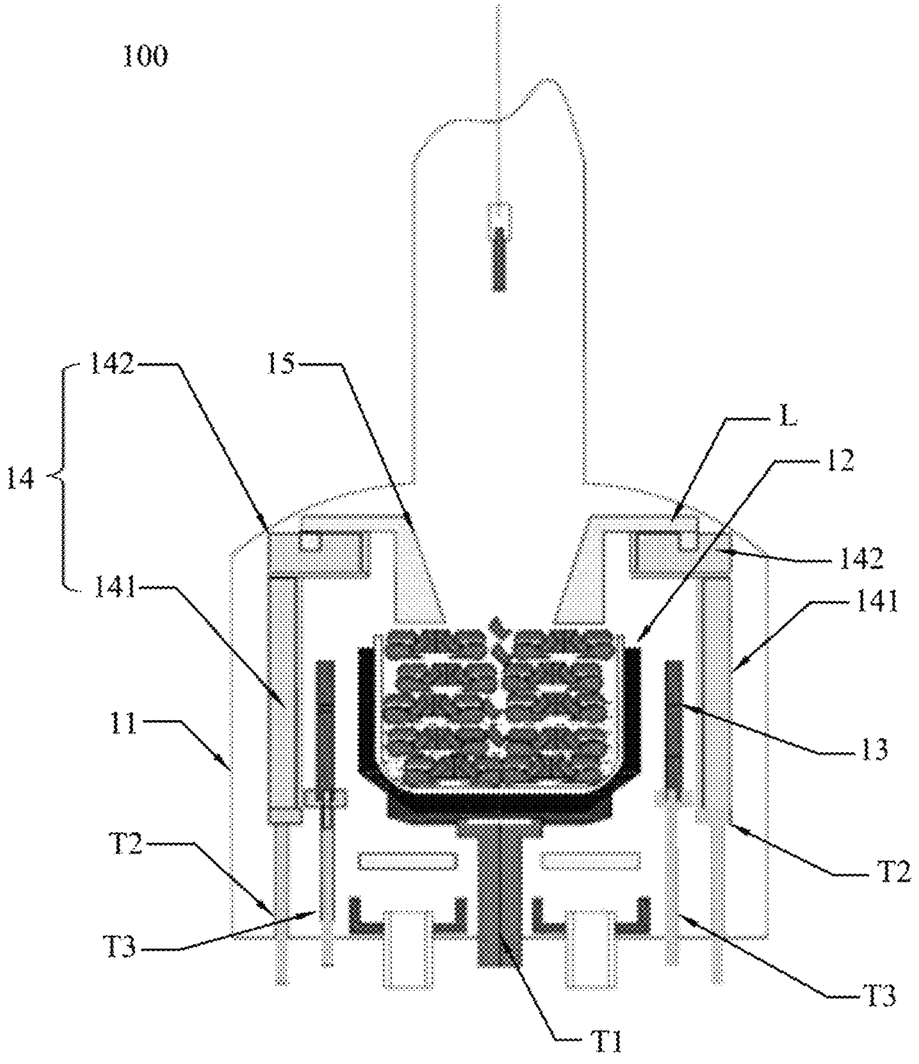
FIG. 3*a* is a schematic view of the positions of the reflector and the heater after the crystal puller being charged with feedstocks illustrated in FIG. 2.
Figure 3B:
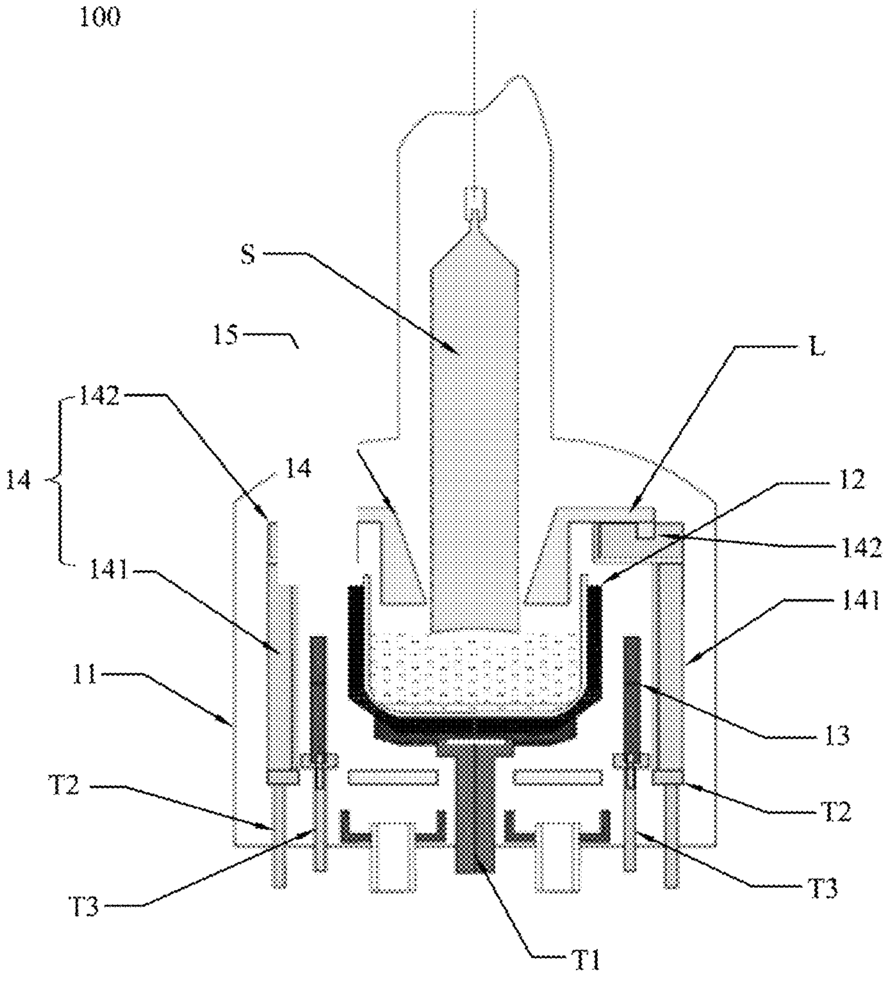
FIG. 3*b* is a schematic view of the positions of the reflector and the heater during melting the polycrystalline silicon feedstock in the crystal puller illustrated in FIG. 2.

The process of pulling monocrystalline silicon ingots S by the crystal puller 100 shown in the FIG. 3 may include the following steps: raising the position of reflector 15 and filling the crucible 12 with polycrystalline silicon feedstocks; subsequently heating the polycrystalline silicon feedstocks in the crucible 12 by the heater 13 to melt the polycrystalline silicon feedstocks to form silicon melt; moving down the reflector 15 after the polycrystalline silicon feedstocks are completely melted so that the distance between the bottom of the reflector 15 and the liquid surface of the silicon melt can ensure the quality of the pulled monocrystalline silicon ingot; stabilizing the temperature of the liquid surface of the silicon melt by the heater 13 and the insulator 14; and pulling the monocrystalline silicon ingots S by making the seed and the silicon melt contact with each other. In the above-mentioned process, in order to always maintain a constant distance between the bottom of the reflector 15 and the liquid surface of the silicon melt, and to avoid the disadvantage of rising the crucible 12 due to the fall of the liquid surface of the silicon melt, the distance between the bottom of the reflector 15 and the liquid surface of the silicon melt is maintained constant by moving down the reflector 15. Refer to the FIG. 4, it illustrates a method for regulating hot zone during single crystal growth provided by embodiments of the present disclosure, the method for regulating hot zone can be carried out by the crystal puller shown in the FIG. 2, the method for regulating hot zone comprises the following steps:

- before growth of the silicon single crystal, moving the insulator with reflector to a highest position, and after polycrystalline silicon feedstock is completely melted into silicon melt, adjusting the reflector to a position at a distance from the liquid surface of the silicon melt; and;
- controlling the height position of the crucible unchanged and rotating the crucible during a crystal pulling process, and moving the insulator with the reflector downward along the vertical direction so as to keep the distance between a bottom of the reflector and the liquid surface of the silicon melt constant during the crystal pulling process.

Figure 4:
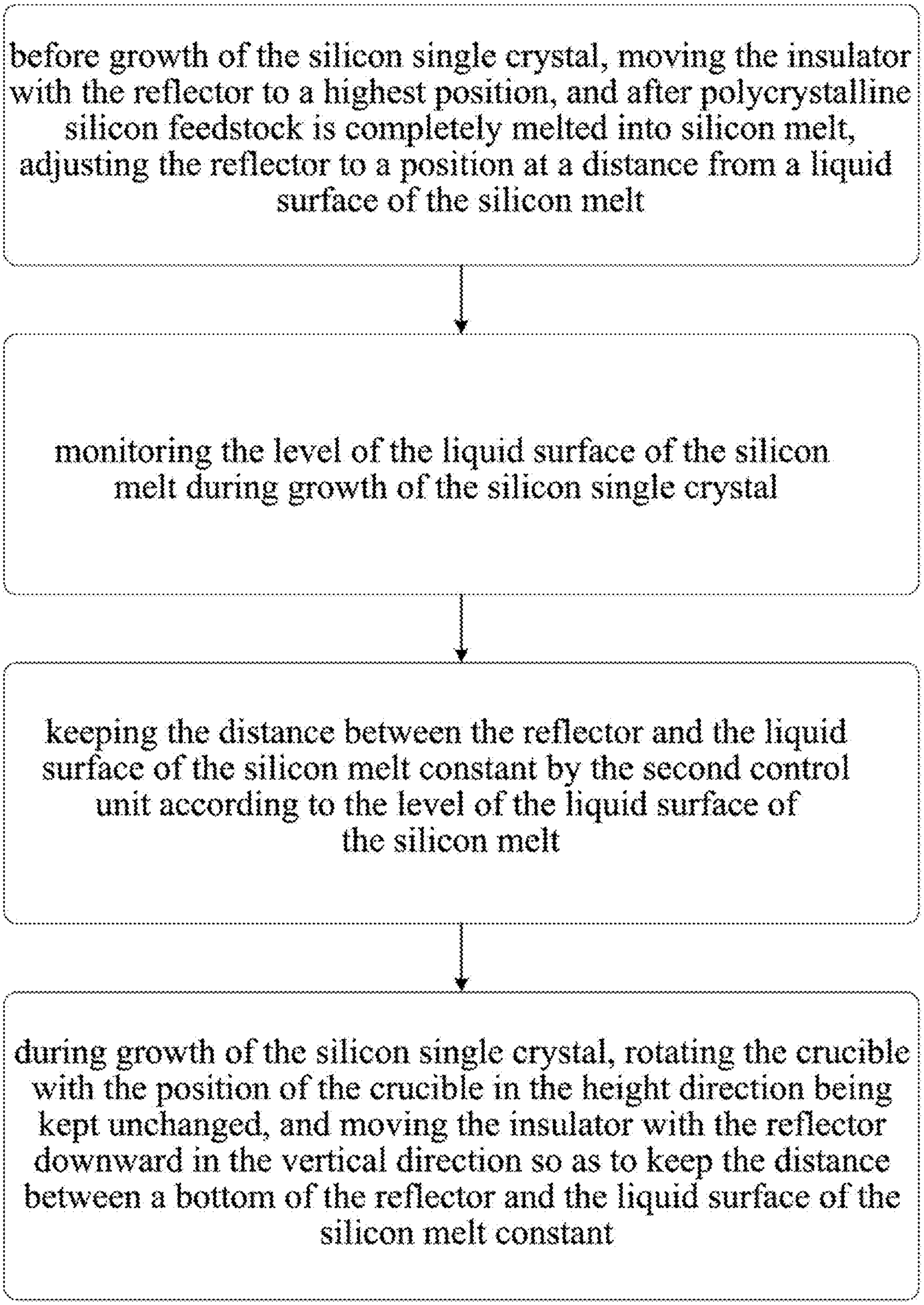
FIG. 4 is a schematic flow view of a method for regulating hot zone during single crystal growth provided by an embodiment of the present disclosure.

With the technical solution shown in the FIG. 4, in the present disclosure the reflector can be moved down by the insulator instead of rising up the crucible, so as to keep the constant distance between the bottom of the reflector and the liquid surface of the silicon melt. Further, the step of moving the insulator with the reflector along the vertical direction so as to keep the distance between a bottom of the reflector and the liquid surface of the silicon melt constant during the crystal pulling process specifically comprises:

- monitoring height variation of level of the liquid surface of the silicon melt during the growth of the silicon single crystal; and
- keeping the distance between the reflector and the liquid surface of the silicon melt constant by the second control unit according to the height variation of the liquid surface of the silicon melt.

Figure 5:
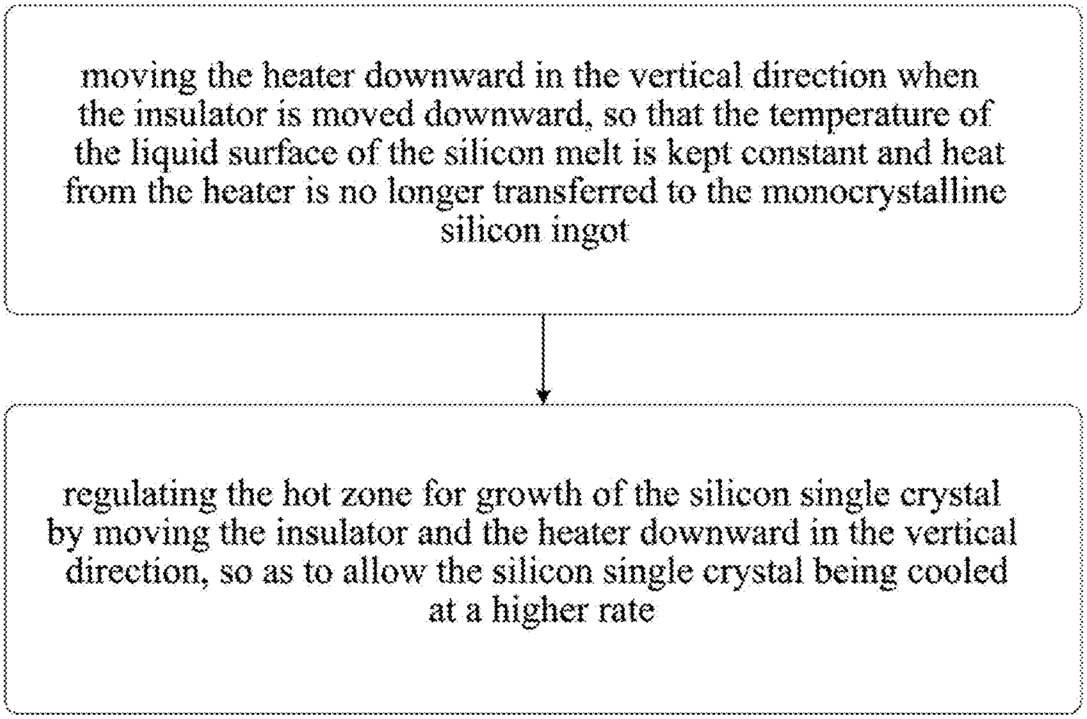
FIG. 5 is a schematic flow view of a method for accelerating cooling of monocrystalline silicon ingots in the method for regulating hot zone during single crystal growth provided by an embodiment of the present disclosure.

As the monocrystalline silicon ingot that have been formed at the top of the liquid surface of the silicon melt is still within the thermal radiation range of the heater when the monocrystalline silicon ingot is pulled out from the silicon melt, heat is dissipated slowly from the monocrystalline silicon ingot, cooling rate of the monocrystalline silicon ingot is reduced, and the pulling speed is unable to be effectively improved. Moreover, the oxygen concentration of the monocrystalline silicon ingot also decreases. Refer to the FIG. 5, the present disclosure also proposes a way for allowing the pulled monocrystalline silicon ingots in an easily cooling state by making both the heater and the insulator move down simultaneously, the method for regulating hot zone comprises:

moving the heater downward along the vertical direction when the insulator is moved downward, so that the temperature of the liquid surface of the silicon melt is kept constant and heat energy from the heater is no longer transferred to the monocrystalline silicon ingot; and;

moving the insulator and the heater downward along the vertical direction simultaneously to improve the thermal field during pulling the monocrystalline silicon ingot so as to pull the monocrystalline silicon ingot with a faster cooling rate compared to the related technology.

Therefore, the present disclosure provides an apparatus and a method for regulating hot zone. Through making the reflector to move down through the insulator instead of rising up the crucible, the present disclosure solves problems of vibrating of the liquid surface of the silicon melt and shaking of the monocrystalline silicon ingot due to rise-up of the crucible, and solves problems of slow heat dissipation and reduced cooling rate of monocrystalline silicon ingots by moving the heater and cooperating with moving down of the insulator.

It should be noted that the technical solutions described in the embodiments of the present disclosure can be combined with each other in any way without conflict.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A method for regulating at least one hot zone for growing a silicon single crystal, comprising:

before growth of the silicon single crystal, moving an insulator with a reflector to a highest position by a second controller, and after polycrystalline silicon feedstock is completely melted into silicon melt, adjusting the reflector to a position at a distance from a liquid surface of the silicon melt by the second controller, wherein an insulator has a top on which a reflector is fixedly arranged; and during growth of the silicon single crystal, rotating a crucible with the position of the crucible in a height direction being kept unchanged by a first controller, and moving the insulator with the reflector downward in a vertical direction by the second controller so as to keep a distance between a bottom of the reflector and the liquid surface of the silicon melt constant, the method further comprising:

regulating the at least one hot zone for growth of the silicon single crystal by separately moving the insulator downward in the vertical direction by the second controller and moving a heater downward in the vertical direction by a third controller, so that a temperature of the liquid surface of the silicon melt is kept constant and heat from the heater is no longer transferred to the silicon single crystal.

2. The method according to claim 1, wherein moving the insulator with the reflector downward in the vertical direction by the second controller so as to keep the distance between the bottom of the reflector and the liquid surface of the silicon melt constant comprises:

monitoring a level of the liquid surface of the silicon melt during growth of the silicon single crystal; and keeping a the distance between the bottom of the reflector and the liquid surface of the silicon melt constant by the second controller according to the level of the liquid surface of the silicon melt.

3. The method according to claim 1, wherein the insulator comprises a side heat insulation cover and a top heat insulation cover, and wherein the side heat insulation cover is arranged in parallel to the heater, the top heat insulation cover is arranged to extend in a horizontal direction from a top of the side heat insulation cover towards the growing silicon single crystal without extending over the crucible, and the reflector is fixedly connected to the top heat insulation cover.

4. The method according to claim 1, wherein the first controller is configured to rotate the crucible about a center axis of the crucible.

5. The method according to claim 1, further comprising a level sensor and a processor, wherein the level sensor is configured to monitor a level of the liquid surface of the silicon melt, and the processor is configured to transmit control signals to the first controller and the second controller based on the level of the liquid surface of the silicon melt.

6. The method according to claim 1, further comprising: monitoring, by a level sensor, a level of the liquid surface of the silicon melt; and transmitting, by a processor, control signals to the first controller and the second controller based on the level of the liquid surface of the silicon melt.

* * * * *